(12) United States Patent
Chu et al.

(10) Patent No.: US 6,924,219 B1
(45) Date of Patent: Aug. 2, 2005

(54) METHOD FOR FORMING POLYSILICON GERMANIUM LAYER

(75) Inventors: Kuo-Tung Chu, Taipei (TW); Li-Wei Cheng, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/849,920

(22) Filed: May 21, 2004

(51) Int. Cl.[7] .............................................. H01L 21/336

(52) U.S. Cl. ...................... 438/592; 438/286; 438/222; 438/585; 438/197; 438/296; 438/509

(58) Field of Search ................................. 438/592, 286, 438/222, 585, 197, 296, 509

(56) References Cited

U.S. PATENT DOCUMENTS

2002/0173130 A1 * 11/2002 Pomerede et al. .......... 438/592

* cited by examiner

*Primary Examiner*—B. William Baumeister
*Assistant Examiner*—Victor V. Yevsikov
(74) *Attorney, Agent, or Firm*—Intellectual Property Solutions, Incorporated

(57) ABSTRACT

A method for forming a polysilicon germanium layer on a gate oxide layer without forming a polysilicon seed layer previously is disclosed. The method uses a chemical vapor deposition process at a temperature range between about 500° C. to about 600° C. by using a $Si_2H_6$ (disilane) gas and a germanium-containing gas as precursors to form a polysilicon germanium layer on a gate dielectric layer as a gate electrode layer. The polysilicon germanium layer directly formed on the gate dielectric layer has a smooth surface.

24 Claims, 3 Drawing Sheets

METHOD FOR FORMING POLYSILICON GERMANIUM LAYER

BACKGROUND OF THE INVENTION

1. Field of the Invention

The present invention relates to a method for forming a polysilicon germanium layer, and more particularly to a method for forming a polysilicon germanium layer on an oxide layer without forming a polysilicon seed layer therebetween.

2. Description of the Related Art

Advances in semiconductor manufacturing technology have led to the integration of tens, and more recently, hundreds of millions of circuit elements, such as transistors, on a single integrated circuit (IC). In order to achieve such increases in density, not only have interconnect line widths become smaller, but so have the dimensions of metal-oxide-semiconductor field effect transistors. MOSFETs are also sometimes referred to as insulated gate field effect transistors (IGFETs). Most commonly, theses devices are referred to simply as FETs, and are so referred to in this disclosure.

Transistor scaling typically involves more than just the linear reduction of the FET width and length. For example, both source/drain (S/D) junction depth and gate insulator thickness are also typically reduced in order to produce a FET with the desired electrical characteristics.

As is well known, the gate electrode of a FET is commonly formed from a patterned layer of polycrystalline silicon. Polycrystalline silicon is also referred to polysilicon. The polysilicon gate electrodes are commonly doped such that the gate electrodes of n-channel FETs (NFETs) are n-type, and the gate electrodes of p-channel FETs (PFETs) are p-type.

Since doped polysilicon is a semiconductive material, it tends to experience the formation of a depletion region adjacent to the interface between the gate electrode and the gate insulator (also referred to as the gate dielectric) when a voltage is applied to the gate electrode. As transistor scaling has substantially reduced the thickness of the gate insulator layer, the width of the depletion region in the doped polysilicon gate electrode has come to play a more significant role in determining the electrical characteristics of the FET. Unfortunately, the occurrence of this depletion region in the gate electrode tends to degrade transistor performance. In order to solve the gate depletion effect, the widely used polysilicon as gate electrode is replaced with poly silicon germanium (SiGe) since poly SiGe has less gate depletion effect. However, since poly SiGe is used as gate electrode material, poly SiGe must be formed on a gate oxide layer. Unlike polysilicon, the surface quality of poly SiGe directly formed on an oxide layer is usually poor even rough. This is because direct deposition of poly SiGe on an oxide layer would induce partial nucleation thereby form a poly SiGe gate electrode with a rough surface. FIGS. 1A and 1B show a photograph and a figure of a direct deposition of poly SiGe on an oxide layer respectively. As shown in FIGS. 1A and 1B, a poly SiGe layer 104 is formed on an oxide layer 102 wherein the oxide layer 102 is formed on a wafer 100. The undesired roughness of a poly SiGe gate electrode surface could induce several problems such as the quality of the later formed film.

To solve the problems caused by the surface roughness of a poly SiGe gate electrode, a polysilicon seed layer is usually formed on the gate oxide layer before depositing the poly SiGe gate electrode. FIGS. 2A and 2B show a photograph and a figure of a poly SiGe layer, an additional polysilicon seed layer and an oxide layer on a wafer respectively. As shown in FIGS. 2A and 2B, a poly SiGe layer 204 is formed on a polysilicon seed layer 206, and the polysilicon seed layer 206 is formed an oxide layer 202, and the oxide layer 202 is formed on a wafer 200. However, the additional polysilicon seed layer between the poly SiGe gate electrode layer and the gate oxide layer would degrade the performance of the poly SiGe gate electrode. Moreover, adding an additional polysilicon seed layer means additional process cost, excess process variable and lower performance of the gate electrode.

Thus it is necessary to provide a new method for forming a polysilicon germanium layer. It is towards those goals that the present invention is specifically directed.

SUMMARY OF THE INVENTION

It is an object of this invention to provide a method for forming a polysilicon germanium layer with a uniform surface on an oxide layer without forming an additional polysilicon seed layer previously.

It is another object of this invention to provide a low cost and simple method to reduce gate depletion effect.

To achieve these objects, and in accordance with the purpose of the invention, the invention use a chemical vapor deposition process at a temperature range between about 500° C. to about 600° C. by using a $Si_2H_6$ (disilane) gas and a germanium-containing gas as precursors to form a polysilicon germanium layer on a gate dielectric layer as a gate electrode layer. The polysilicon germanium layer directly formed on the gate dielectric layer has a smooth surface.

It is to be understood that both the foregoing general description and the following detailed description are exemplary and explanatory only and are not restrictive of the invention, as claimed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
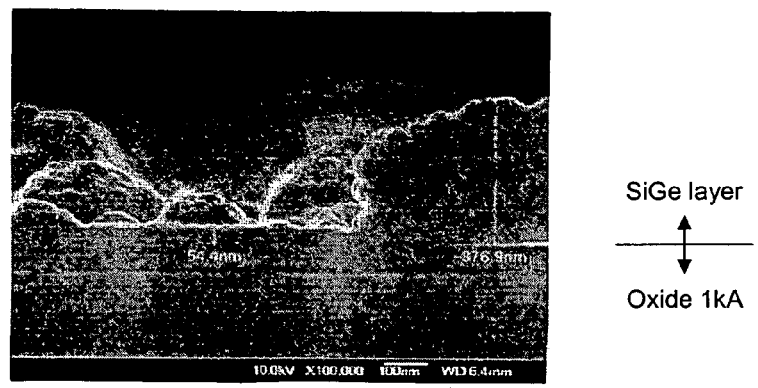
FIG. 1A shows a photograph of a direct deposition of poly SiGe on an oxide layer.

Polysilicon gate depletion effect refers to the carrier depletion effect observed in gate electrodes formed from semiconductive materials, such as doped polysilicon. The carrier depletion effect in polysilicon gate electrodes occurs when an applied electric field sweeps away carriers so as to create a region in the doped polysilicon where the non-mobile dopant atoms become ionized. In n-doped polysilicon the depletion layer includes ionized non-mobile donor sites, whereas in p-doped polysilicon the depletion layer includes ionized non-mobile acceptor sites. This depletion effect results in a reduction in the strength of the expected electric field at the surface of the semiconductor when a voltage is applied to the gate electrode. The reduced electric field strength adversely affects transistor performance.

In conventional FETs, polysilicon is used as the gate electrode material. The polysilicon is typically doped to be p-type or n-type, using operations such as ion implantation or thermal diffusion. It has been found that polysilicon gate electrodes of FETs exhibit a carrier depletion effect that degrades the electrical performance of the transistor.

The use of thinner gate insulators, will tend to make the carrier depletion effect on device degradation even worse. With thinner gate oxides, the polysilicon gate depletion layer will become significant in dimension when compared to the gate oxide thickness and therefore reduce device performance. Typical depletion layer width in doped polysilicon gate electrodes is believed to be in the range of approximately 10 to 40 angstroms. This carrier depletion effect in the gate electrode limits device scalability by imposing a lower bound on how much the effective gate insulator thickness of the FET can be reduced. In other words, the depletion layer in the gate electrode effectively moves the gate electrode further from the surface of the semiconductor and therefore makes it more difficult for the applied electric field to create an inversion layer at the surface of the semiconductor.

The use of silicon-germanium (SiGe) can alleviate the above described problems to some extent. However, depositing a layer of SiGe on ultra-thin gate oxides is exceedingly difficult, as it tends to be discontinuous, rough and non-uniform. The problem of obtaining a smooth and continuous SiGe film on ultra-thin oxides of silicon is overcome in embodiments of the present invention.

The present invention will be described in detail with reference to the accompanying drawings. It should be noted that the drawings are in greatly simplified form and they are not drawn to scale. Moreover, dimensions have been exaggerated in order to provide a clear illustration and understanding of the present invention.

The invention provides a method for forming a polysilicon germanium layer with a uniform surface on an oxide layer as a gate electrode layer to reduce gate depletion effect. The polysilicon germanium layer is formed by a chemical vapor deposition process which uses a $Si_2H_6$ (disilane) gas and a germanium-containing gas as precursors. The reacting temperature is between about 500° C. to about 600° C. The germanium-containing gas comprises a $GeH_4$ gas and a Ge gas. If a $GeH_4$ gas is used as the germanium-containing gas, the precursors are a $Si_2H_6$ gas and the $GeH_4$ gas, while when a Ge gas is used as the germanium-containing gas, the precursors are a $Si_2H_6$ gas, the Ge gas and a $H_2$ gas. If the $Si_2H_6$ gas and the $GeH_4$ gas are used as precursors, the gas flow rate of the $Si_2H_6$ gas is in the range of about 5 sccm to about 15 sccm and the gas flow rate of the $GeH_4$ gas is in the range of about 20 sccm to about 240 sccm. If a Ge gas and a $H_2$ gas are used as precursors, the gas flow rate of the Ge gas is in the range of about 20 sccm to about 240 sccm, and the gas flow rate of the $H_2$ gas is in the range of about 40 sccm to about 480 sccm.

Figure 1B:
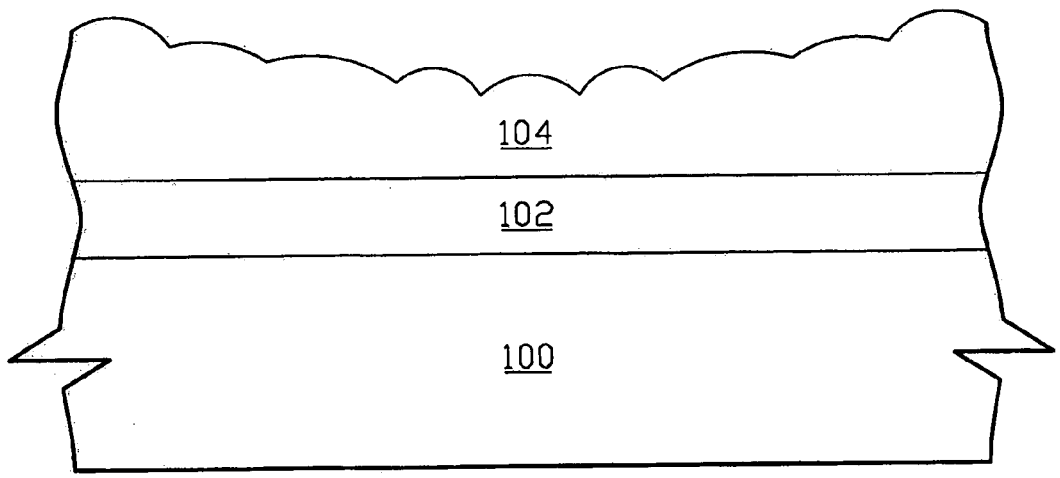
FIG. 1B shows a figure of a direct deposition of poly SiGe on an oxide layer.
Figure 2A:
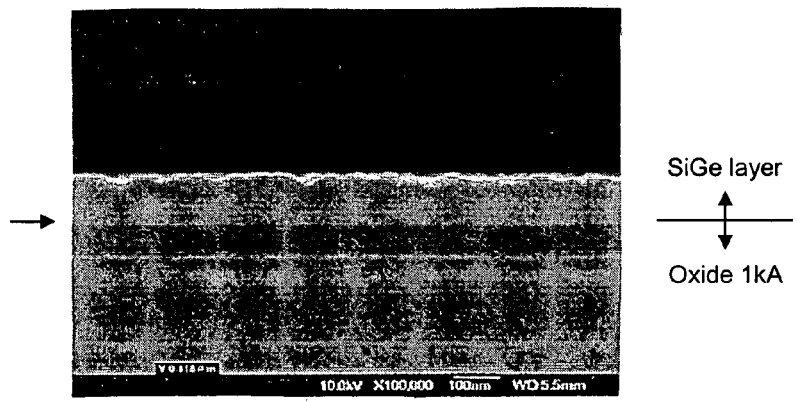
FIG. 2A shows a photograph of a poly SiGe layer, an additional polysilicon seed layer and an oxide layer on a wafer.
Figure 2B:
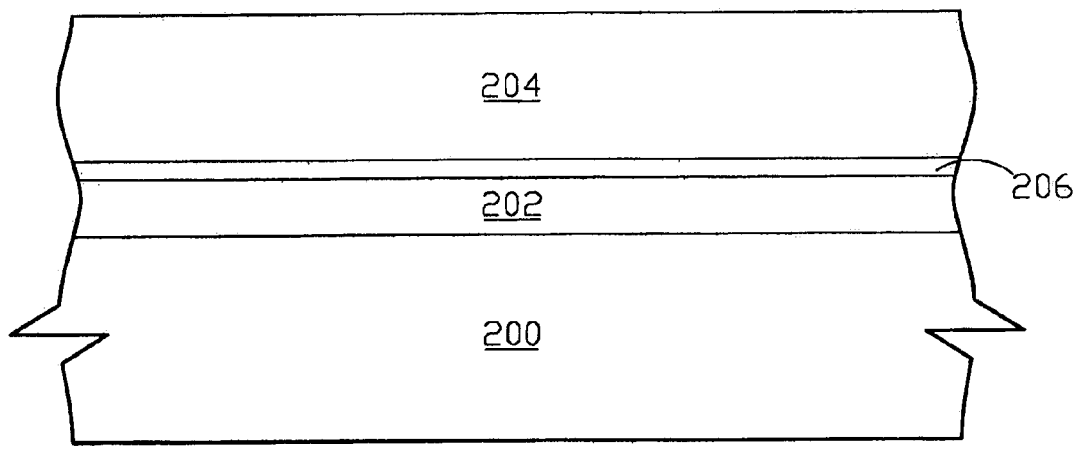
FIG. 2B shows a figure of a poly SiGe layer, an additional polysilicon seed layer and an oxide layer on a wafer.
Figure 3A:
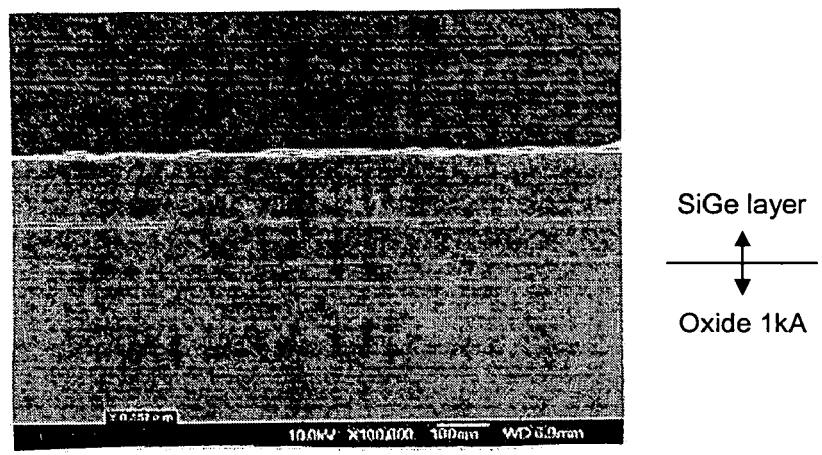
FIG. 3A shows a photograph of a poly SiGe layer of the invention and an oxide layer on a wafer.
Figure 3B:
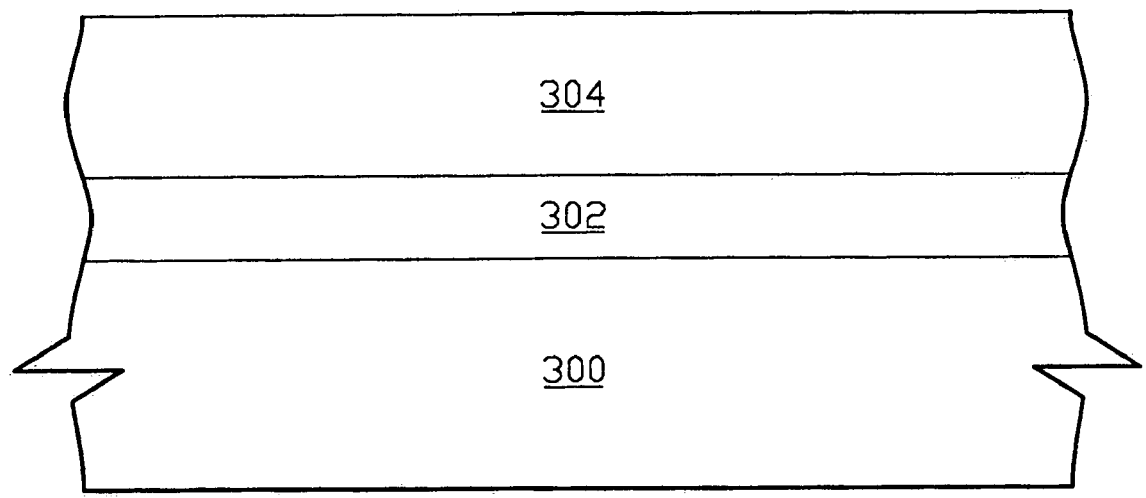
FIG. 3B shows a figure of a poly SiGe layer of the invention and an oxide layer on a wafer.

FIGS. 3A and 3B show a photograph and a figure of a poly SiGe layer and an oxide layer on a wafer respectively. As shown in FIGS. 3A, a poly SiGe layer with a smooth surface is formed on an oxide layer by the chemical vapor deposition process which uses a $Si_2H_6$ (disilane) gas and a germanium-containing gas as precursors as described above. As shown in FIGS. 3B and 3B, a poly SiGe layer 304 is formed on an oxide layer 302, and the oxide layer 302 is formed on a wafer 300. Comparing to FIGS. 1A and 1B, without forming a polysilicon seed layer on the oxide layer previously, the poly SiGe layer formed by the method of the invention which uses a $Si_2H_6$ (disilane) gas and a germanium-containing gas as precursors has a much more smoother surface than the SiGe layer in FIGS. 1A and 1B. Moreover, the poly SiGe layer formed by the method has a flat surface similar to the poly SiGe layer shown in FIGS. 2A and 2B.

The oxide layer on which the poly SiGe layer is formed mentioned above is not limited as a silicon dioxide layer, although the material most commonly used in the semiconductor industry to form the gate insulator layer of a metal oxide field effect transistor (MOSFET) is silicon dioxide. The gate insulator layer is frequently referred to simply as the gate oxide. The expression gate dielectric is also used to describe the gate insulator layer. Those skilled in the art will appreciate that gate dielectric layers may also be formed from a variety of materials, thicknesses, or multiple layers of material. By way of illustration and not limitation, gate dielectric layers may include oxide/nitride stacks, other oxides, or other dielectric materials with electrical properties suitable for use as a MOSFET gate dielectric layer.

The poly SiGe is referred to polycrystalline silicon germanium. Poly SiGe is only an example of polycrystalline silicon germanium. Poly $Si_xGe_y$ is also polycrystalline silicon germanium. Polycrystalline silicon is a nonporous form of silicon often formed by chemical vapor deposition from a silicon source gas or other methods and has a structure that contains crystallites or domains with large-angle grain boundaries, twin boundaries, or both.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method for forming a polysilicon germanium layer, said method for forming a polysilicon germanium layer comprising:
   providing a substrate having a gate dielectric layer thereon; and
   performing a chemical vapor deposition process by using a $Si_2H_6$ (disilane) gas, a $H_2$ gas and a germanium-containing gas as precursors to form a polysilicon germanium layer on said gate dielectric layer as a gate electrode layer without previously forming a seed layer on said gate dielectric layer.

2. The method according to claim 1, wherein said substrate comprises a silicon wafer.

3. The method according to claim 1, wherein said gate dielectric layer comprises a gate oxide layer.

4. The method according to claim 1, wherein said germanium-containing gas comprises a $GeH_4$ gas.

5. The method according to claim 4, wherein said $Si_2H_6$ (disilane) gas has a flow rate in the range of about 5 sccm to about 15 sccm and said $GeH_4$ gas has a flow rate in the range of about 20 sccm to about 240 sccm.

6. The method according to claim 1, wherein said germanium-containing gas comprises a Ge gas.

7. The method according to claim 6, wherein said Ge gas has a flow rate in the range of about 20 sccm to about 240 sccm, and said $H_2$ gas has a flow rate in the range of about 40 sccm to about 480 sccm.

8. The method according to claim 1, wherein said polysilicon germanium layer comprises SiGe.

9. The method according to claim 1, wherein said polysilicon germanium layer comprises $Si_xGe_y$.

10. The method according to claim 1, wherein said chemical vapor deposition process is performed at a temperature range between about 500° C. to about 600° C.

11. A method for forming a polysilicon germanium layer, said method for forming a polysilicon germanium layer comprising:
providing a substrate having a gate dielectric layer thereon; and
performing a chemical vapor deposition process by using a $Si_2H_6$ (disilane) gas, a $H_2$ gas and a $GeH_4$ gas as precursors to form a polysilicon germanium layer on said gate dielectric layer as a gate electrode layer without previously forming a seed layer on said gate dielectric layer.

12. The method according to claim 11, wherein said substrate comprises a silicon wafer.

13. The method according to claim 11, wherein said gate dielectric layer comprises a gate oxide layer.

14. The method according to claim 11, wherein said $Si_2H_6$ (disilane) gas has a flow rate in the range of about 5 sccm to about 15 sccm and said $GeH_4$ gas has a flow rate in the range of about 20 sccm to about 240 sccm.

15. The method according to claim 11, wherein said polysilicon germanium layer comprises SiGe.

16. The method according to claim 11, wherein said polysilicon germanium layer comprises $Si_xGe_y$.

17. The method according to claim 11, wherein said chemical vapor deposition process is performed at a temperature range between about 500° C. to about 600° C.

18. A method for forming a polysilicon germanium layer, said method for forming a polysilicon germanium layer comprising:
providing a substrate having a gate dielectric layer thereon; and
performing a chemical vapor deposition process by using a $Si_2H_6$ (disilane) gas, a Ge gas and a $H_2$ gas as precursors to form a polysilicon germanium layer on said gate dielectric layer as a gate electrode layer without previously forming a seed layer on said gate dielectric layer.

19. The method according to claim 18, wherein said substrate comprises a silicon wafer.

20. The method according to claim 18, wherein said gate dielectric layer comprises a gate oxide layer.

21. The method according to claim 18, wherein said $Si_2H_6$ (disilane) gas has a flow rate in the range of about 5 sccm to about 15 sccm, said Ge gas has a flow rate in the range of about 20 sccm to about 240 sccm, and said $H_2$ gas has a flow rate in the range of about 40 sccm to about 480 sccm.

22. The method according to claim 18, wherein said polysilicon germanium layer comprises SiGe.

23. The method according to claim 18, wherein said polysilicon germanium layer comprises $Si_xGe_y$.

24. The method according to claim 18, wherein said chemical vapor deposition process is performed at a temperature range between about 500° C. to about 600° C.

* * * * *